(12) United States Patent
Yabe et al.

(10) Patent No.: US 10,540,561 B2
(45) Date of Patent: Jan. 21, 2020

(54) INSPECTION METHOD AND INSPECTION APPARATUS

(71) Applicant: NUFLARE TECHNOLOGY, INC., Yokohama-shi (JP)

(72) Inventors: Makoto Yabe, Yokohama (JP); Hiroteru Akiyama, Yokohama (JP); Takafumi Inoue, Chigasaki (JP)

(73) Assignee: NUFLARE TECHNOLOGY, INC., Yokohama-shi (JP)

( * ) Notice: Subject to any disclaimer, the term of this patent is extended or adjusted under 35 U.S.C. 154(b) by 0 days.

(21) Appl. No.: 16/145,643

(22) Filed: Sep. 28, 2018

(65) Prior Publication Data

US 2019/0095740 A1  Mar. 28, 2019

(30) Foreign Application Priority Data

Sep. 28, 2017  (JP) .................. 2017-188970

(51) Int. Cl.
  *G03F 7/20* (2006.01)
  *G06K 9/32* (2006.01)
  (Continued)

(52) U.S. Cl.
  CPC ............. *G06K 9/3216* (2013.01); *G03F 1/42* (2013.01); *G03F 1/84* (2013.01); *G03F 9/7007* (2013.01);
  (Continued)

(58) Field of Classification Search
  CPC ... G01N 2021/95676; G03F 1/42; G03F 1/84; G03F 9/7007; G06K 9/3216; G06T 7/0004; G06T 2207/30108
  (Continued)

(56) References Cited

U.S. PATENT DOCUMENTS

| 4,926,489 A * | 5/1990 | Danielson | ........ G01N 21/95607 356/399 |
| 2013/0078555 A1* | 3/2013 | Orihara | ..................... G03F 1/24 430/5 |

(Continued)

FOREIGN PATENT DOCUMENTS

| JP | 2-109317 | 4/1990 |
| JP | 6-69319 | 3/1994 |

(Continued)

*Primary Examiner* — Colin W Kreutzer
(74) *Attorney, Agent, or Firm* — Oblon, McClelland, Maier & Neustadt, L.L.P.

(57) ABSTRACT

An inspection method includes a rough alignment process of acquiring optical images of first and second patterns previously set to confirm whether a position misalignment amount in a rotation direction of a sample with respect to an X or Y direction is equal to or smaller than a first acceptable value, and conforming whether the position misalignment amount is equal to or smaller than the first acceptable value on the basis of an acquisition result, and a fine alignment process of acquiring optical images of third patterns positioned on different corners of a rectangular frame constituted of four sides along the X or Y direction on an optical image of the sample and rotating a stage until a position misalignment amount detected based on the optical images of the third patterns becomes equal to or smaller than a second acceptable value being smaller than the first acceptable value.

8 Claims, 13 Drawing Sheets

(51) Int. Cl.
*G06T 7/00* (2017.01)
*G03F 1/42* (2012.01)
*G03F 1/84* (2012.01)
*G03F 9/00* (2006.01)

(52) U.S. Cl.
CPC .. *G06T 7/0004* (2013.01); *G06T 2207/30108* (2013.01)

(58) Field of Classification Search
USPC .... 355/30, 67, 68, 75, 77; 356/237.4, 237.5, 356/399–401; 430/5, 22
See application file for complete search history.

(56) References Cited

U.S. PATENT DOCUMENTS

| | | | | |
|---|---|---|---|---|
| 2013/0245971 | A1* | 9/2013 | Kusunose | G01R 31/26 702/59 |
| 2014/0302429 | A1* | 10/2014 | Shoki | G03F 1/24 430/5 |
| 2016/0004153 | A1* | 1/2016 | Shoki | G03F 1/24 204/192.13 |
| 2018/0232873 | A1* | 8/2018 | Inoue | G03F 1/84 |

FOREIGN PATENT DOCUMENTS

| | | |
|---|---|---|
| JP | 9-306977 | 11/1997 |
| JP | 2000-21769 | 1/2000 |
| JP | 2003-37041 | 2/2003 |
| JP | 2015-130412 | 7/2015 |

\* cited by examiner

INSPECTION METHOD AND INSPECTION APPARATUS

CROSS-REFERENCE TO RELATED APPLICATIONS

This application is based upon and claims the benefit of priority from Japanese Patent Application No. 2017-188970, filed on Sep. 28, 2017, the entire contents of which are incorporated herein by reference.

FIELD

The embodiments of the present invention relate to an inspection method and an inspection apparatus.

BACKGROUND

In an inspection of defects of patterns formed on a photomask (hereinafter, also simply "mask") to be used for photolithography, an automatic alignment method of automatically aligning a mask that is loaded onto a stage having an XY plane on which the mask can be placed, so as not to have an inclination with respect to an X direction or a Y direction being movement directions of the stage before starting the inspection has been adopted. In the conventional automatic alignment method, a specific pattern such as a cross shape is previously formed on an inspection region of a mask for automatic alignment and the specific pattern is detected from a high-magnification image obtained by imaging the mask at a high magnification. Automatic alignment is then performed by rotating the stage along with the mask on the basis of the detected specific pattern so as to eliminate an inclination of the mask with respect to a movement direction of the stage along stripes that are obtained by virtually dividing the mask inspection region on which defects of patterns are to be inspected into a plurality of strip shapes.

SUMMARY

However, the conventional automatic alignment method is intended for a mask on which a specific pattern dedicated to automatic alignment is formed, and is not intended for a general mask on which no specific pattern is formed. That is, in the case of a mask having no specific pattern, the automatic alignment described above cannot be performed. Therefore, improvement of versatility of the alignment has been demanded.

An object of the present invention is to provide an inspection method and an inspection apparatus that enable automatic alignment in rotation of a stage even for a mask having no specific pattern.

An inspection method according to an aspect of the present invention is an inspection method of inspecting defects of patterns provided in an inspection region of a sample, using an inspection apparatus comprising a stage having an XY plane on which the sample can be placed and being movable in an X direction and a Y direction and rotatable on a Z axis substantially perpendicular to the XY plane, the method comprising:

performing rough alignment to confirm whether a position misalignment amount in a rotation direction of the sample with respect to the X direction or the Y direction is equal to or smaller than a first acceptable value; and performing fine alignment to correct the position misalignment amount to be equal to or smaller than a second acceptable value being smaller than the first acceptable value, wherein the performing of the rough alignment comprises acquiring an optical image of a first pattern on the inspection region of the sample, the first pattern being previously set as a pattern to be used for the rough alignment, moving the stage from a position of the stage at a time of acquisition of the optical image of the first pattern in the X direction or the Y direction by a predetermined movement amount, and recognizing that the position misalignment amount is equal to or smaller than the first acceptable value in a case where an optical image of a second pattern on the inspection region, the second pattern being previously set as a pattern to be used for the rough alignment and being positioned to be separated from the first pattern in the X direction or the Y direction, is acquired when the stage is moved by the movement amount, and recognizing that the position misalignment amount is larger than the first acceptable value in a case where an optical image of the second pattern is not acquired, and the performing of the fine alignment comprises acquiring optical images of a plurality of third patterns to be used for the fine alignment, the third patterns being respectively positioned on a plurality of different corners of a rectangular frame constituted of four sides along the X direction or the Y direction on the inspection region of an optical image of the sample when it is confirmed by the rough alignment that the position misalignment amount is equal to or smaller than the first acceptable value, detecting the position misalignment amount on a basis of the acquired optical images of the third patterns, and rotating the stage until the detected position misalignment amount becomes equal to or smaller than the second acceptable value.

In the inspection method, the third patterns cam be patterns positioned in a plurality of regions in a predetermined range set at each of a plurality of corners of the inspection region and having an edge along at least one of the X direction and the Y direction.

In the inspection method, the performing of the fine alignment can comprise reacquiring an optical image of the first pattern when the position misalignment amount has not become equal to or smaller than the second acceptable value in spite of the rotation of the stage, reacquiring optical images of the third patterns by a relative movement from the reacquired optical image of the first pattern, redetecting the position misalignment amount on a basis of the reacquired optical images of the third patterns, and rotating again the stage to cause the redetected position misalignment amount to become equal to or smaller than the second acceptable value.

In the inspection method, the third pattern can be a pattern positioned within a certain distance from the first pattern.

An inspection apparatus according to an aspect of the present invention is an inspection apparatus inspecting defects of patterns provided in an inspection region of a sample and comprising a stage having an XY plane on which the sample can be placed and being movable in an X direction and a Y direction and rotatable on a Z axis substantially perpendicular to the XY plane, the apparatus comprising:

a rough alignment part performing rough alignment to confirm whether a position misalignment amount in a rotation direction of the sample with respect to the X direction or the Y direction is equal to or smaller than a first acceptable value; and a fine alignment part performing fine alignment to correct the position misalignment amount to be equal to or smaller than a second acceptable value being smaller than the first acceptable value, wherein the rough alignment part acquires an optical image of a first pattern on the inspection region of the sample, the first pattern being previously set as a pattern to be used for the rough alignment, moves the stage from a position of the stage at a time of acquisition of the optical image of the first pattern in the X direction or the Y direction by a predetermined movement amount, and recognizes that the position misalignment amount is equal to or smaller than the first acceptable value in a case where an optical image of a second pattern on the inspection region, the second pattern being previously set as a pattern to be used for the rough alignment and being positioned to be separated from the first pattern in the X direction or the Y direction, is acquired when the stage is moved by the movement amount, and recognizes that the position misalignment amount is larger than the first acceptable value in a case where an optical image of the second pattern is not acquired, and the fine alignment part acquires optical images of a plurality of third patterns to be used for the fine alignment, the third patterns being respectively positioned on a plurality of different corners of a rectangular frame constituted of four sides along the X direction or the Y direction on the inspection region of an optical image of the sample when it is confirmed by the rough alignment that the position misalignment amount is equal to or smaller than the first acceptable value, detects the position misalignment amount on a basis of the acquired optical images of the third patterns, and rotates the stage until the detected position misalignment amount becomes equal to or smaller than the second acceptable value.

According to the present invention, as alignment without the need of a specific pattern can be performed, the versatility of the alignment can be improved.

DETAILED DESCRIPTION

Figure 1:
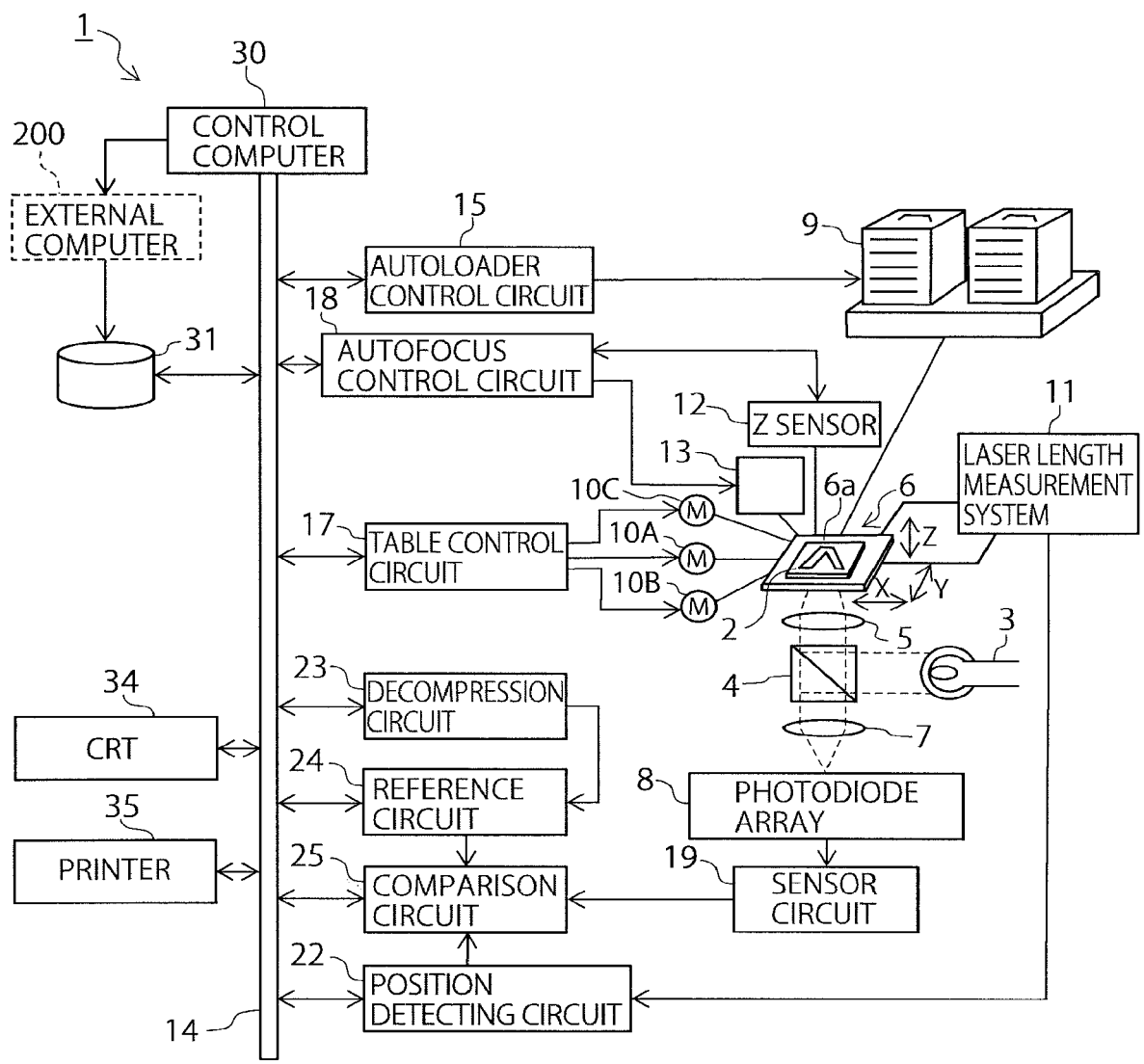
FIG. 1 is a diagram illustrating a pattern inspection apparatus according to a first embodiment.

Embodiments of the present invention will be described below in detail with reference to the accompanying drawings. These embodiments do not limit the present invention. In the drawings referred to in the embodiments, like or similar reference characters are denoted to parts having like or similar functions, and redundant explanations therefor are omitted.

First Embodiment

FIG. 1 is a diagram illustrating a pattern inspection apparatus 1 according to a first embodiment as an example of an inspection apparatus. The pattern inspection apparatus 1 illustrated in FIG. 1 can be used, for example, to inspect defects of patterns formed on a lithographic mask 2 being an example of a sample by a D-DB (Die to Database) inspection.

As illustrated in FIG. 1, the pattern inspection apparatus 1 includes a light source 3, a polarizing beam splitter 4, an objective lens 5, an XYθ table 6 being an example of a stage, an imaging lens 7, and a photodiode array 8 in this order in a light traveling direction. A wave plate that changes a light polarizing direction can be placed between the polarizing beam splitter 4 and the XYθ table 6.

The light source 3 emits laser light toward the polarizing beam splitter 4. The polarizing beam splitter 4 reflects the light from the light source 3 toward the objective lens 5. The objective lens 5 irradiates the XYθ table 6 with the light reflected by the polarizing beam splitter 4.

The XYθ table 6 has an XY plane 6a on which the sample (mask) 2 can be placed. The XYθ table 6 is movable in an X direction, a Y direction, and a direction (a Z direction) perpendicular to the XY plane 6a and is rotatable on a Z axis perpendicular to the XY plane 6a (in a rotation direction). Hereinafter, the rotation direction of the XYθ table 6 is also referred to as "θ direction". The Z axis is also referred to as "θ axis".

The mask 2 placed on the XYθ table 6 reflects the light irradiated by the objective lens 5. The mask 2 is illuminated with the reflection light of the mask 2. The reflection light of the mask 2 transmits through the objective lens 5 and the polarizing beam splitter 4 and then enters the imaging lens 7. The imaging lens 7 forms an image with the incident reflection light of the mask 2 on the photodiode array 8 as an optical image of the mask 2. The photodiode array 8 picks up the optical image of the mask 2 and performs a photoelectric conversion. An electrical signal of the mask 2 obtained by the photoelectric conversion is transmitted to a sensor circuit 19 and is subjected to an A/D conversion, and resultant image data is then transmitted to a comparison circuit 25. Defects of the pattern formed on the mask 2 are inspected based on the acquired image data.

As illustrated in FIG. 1, the pattern inspection apparatus 1 includes also an autoloader 9, an X-axis motor 10A, a Y-axis motor 10B, a θ-axis motor 10C, a laser length measurement system 11, a Z sensor 12, and a focusing mechanism 13.

The autoloader 9 automatically conveys the mask 2 onto the XYθ table 6. The X-axis motor 10A, the Y-axis motor 10B, and the θ-axis motor 10C move the XYθ table 6 in the X direction, the Y direction, and the θ direction, respectively. Due to moving of the XYθ table 6, the mask 2 on the XYθ table 6 is scanned with the light from the light source 3. The laser length measurement system 11 detects positions of the XYθ table 6 in the X direction and the Y direction.

The Z sensor 12 detects the height of a mask face being the surface of the mask 2 on a pattern side, that is, the position thereof in the Z direction. The Z sensor 12 can include, for example, a phototransmitter that irradiates the mask face with light, and a photoreceiver that receives irradiated light.

The focusing mechanism 13 performs focusing to put the focus of the objective lens 5 on the mask face. The focusing is performed, for example, by moving the XYθ table 6 in the Z direction by a movement amount according to the height of the mask face detected by the Z sensor 12.

Further, as illustrated in FIG. 1, the pattern inspection apparatus 1 includes various circuits connected to a bus 14. Specifically, the pattern inspection apparatus 1 includes an autoloader control circuit 15, a table control circuit 17, and an autofocus control circuit 18. The pattern inspection apparatus 1 also includes a position detecting circuit 22, a decompression circuit 23, a reference circuit 24, and the comparison circuit 25. The pattern inspection apparatus 1 also includes the sensor circuit 19 and the sensor circuit 19 is connected between the photodiode array 8 and the comparison circuit 25.

The autoloader control circuit 15 controls the autoloader 9 to automatically convey the mask 2 onto the XYθ table 6.

The table control circuit 17 executes control to scan an inspection region 201 (see FIG. 3) of the mask 2 where defects of the pattern are to be inspected with the light from the light source 3. The scan is performed along stripes 202 that are obtained by virtually dividing the inspection region 201 into a plurality of strip shapes. Specifically, the table control circuit 17 drives and controls the motors 10A to 10C to move the XYθ table 6 so as to scan the inspection region 201 with the light from the light source 3 along the stripes 202.

The autofocus control circuit 18 controls the focusing mechanism 13 according to the height of the mask face detected by the Z sensor 12 to automatically focus the light of the light source 3 on the mask face.

The sensor circuit 19 captures the electrical signal obtained by the photoelectric conversion of the photodiode array 8 and performs A/D conversion of the captured electrical signal. The sensor circuit 19 outputs optical image data obtained by the A/D conversion to the reference circuit 24 and the comparison circuit 25. The sensor circuit 19 can be, for example, a circuit of a TDI (Time Delay Integration) sensor. With use of the TDI sensor, a pattern can be imaged with high accuracy.

The laser length measurement system 11 detects the movement position of the XYθ table 6 and outputs the detected movement position to the position detecting circuit 22. The position detecting circuit 22 detects the position of the mask 2 on the XYθ table 6 on the basis of the movement position input from the laser length measurement system 11. The position detecting circuit 22 outputs the detected position of the mask 2 to the comparison circuit 25.

The decompression circuit 23 reads design data collected in a magnetic disk device 31, which will be described later, from the magnetic disk device 31 and converts the read design data into binary or multi-valued reference image data. The decompression circuit 23 outputs the resultant reference image data to the reference circuit 24.

The reference circuit 24 performs filtering processing appropriate for the reference image data input from the decompression circuit 23 to generate a reference image to be used for a defect inspection on the mask 2. The reference circuit 24 outputs the generated reference image to the comparison circuit 25.

The comparison circuit 25 inspects defects of the pattern formed on the mask 2 on the basis of a comparison between the optical image of the mask 2 input from the sensor circuit 19 and the reference image input from the reference circuit 24. For example, the comparison circuit 25 measures a line width at each position of the pattern of the optical image using the position information input from the position detecting circuit 22 and compares line widths or values of tone (lightness) between the measured pattern of the optical image and the pattern of the reference image input from the reference circuit 24. The comparison circuit 25 detects, for example, an error between the line width of the pattern of the optical image and the line width of the pattern of the reference image as a defect of the pattern.

In addition to the configuration described above, the pattern inspection apparatus 1 includes also a control computer 30, the magnetic disk device 31, a CRT (Cathode Ray Tube) 34, and a printer 35 as illustrated in FIG. 1. These constituent parts 30 to 35 are all connected to the bus 14.

The control computer 30 executes various types of control and processing related to the defect inspection to the constituent parts connected to the bus 14. The magnetic disk device 31 has stored therein the design data of the mask 2. The CRT 34 displays various images related to the defect inspection. The printer 35 prints various types of information related to the defect inspection.

The control computer 30 acquires image data of a first pattern and a second pattern that are formed in the inspection region 201 on the mask 2 and that are to be used for rough alignment from the sensor circuit 19 as will be described in detail later.

The first pattern to be used for the rough alignment is hereinafter referred to as "first rough alignment pattern". The second pattern to be used for the rough alignment is referred to as "second rough alignment pattern". The rough alignment is processing of confirming whether a position misalignment amount in the rotation direction (that is, the A direction) of the mask 2 on the XYθ table 6 with respect to a movement direction (the X-axis direction) of the XYθ table 6 moving along the longitudinal direction of the stripes 202 or a movement direction (the Y-axis direction) of the XYθ table 6 moving along the transverse direction of the stripes 202 is equal to or smaller than a first acceptable value. In other words, the position misalignment amount in the rotation direction of the mask 2 with respect to the movement direction (the X-axis direction or the Y-axis direction) of the XYθ table 6 is a position misalignment amount of location of the mask 2 with respect to the XYθ table 6, that is, an inclination of an end side of the mask 2 along the stripes 202 with respect to the movement direction of the XYθ table 6 along the stripes 202.

When the position misalignment amount in the rotation direction of the mask 2 with respect to the X-axis direction or the Y-axis direction is too large, an alignment amount for fine alignment, which will be described later, may be excessive, so that a time required for the fine alignment becomes long. Therefore, the rough alignment is performed before the fine alignment to prevent the required time for the fine alignment from becoming long. That is, in the rough alignment, it is confirmed beforehand that the position misalignment amount in the rotation direction of the mask 2 with respect to the X-axis direction or the Y-axis direction is not too large. Unlike the fine alignment, processing to correct the position misalignment is not performed in the rough alignment. When the position misalignment is larger than the first acceptable value, the rough alignment processing or the defect inspection is stopped as an error.

More specifically, in the rough alignment, the control computer 30 first acquires an optical image of the first rough alignment pattern previously set on the inspection region of the mask 2.

Next, the control computer 30 moves the XYθ table 6 in the X direction or the Y direction from a position of the XYθ table 6 at a time when the optical image of the first rough alignment pattern has been acquired by a predetermined movement amount (vector). This movement amount is a movement amount corresponding to the distance from the optical image of the first rough alignment pattern to an optical image of the second rough alignment pattern, which will be described later. This movement amount is a movement amount having been known when the first rough alignment pattern and the second rough alignment pattern are set as patterns to be used for the rough alignment.

Subsequently, the control computer 30 recognizes that the position misalignment amount is equal to or smaller than the first acceptable value in a case where an optical image of the second rough alignment pattern on the inspection region, which is previously set as the pattern to be used for the rough alignment and is separated from the first rough alignment pattern in the X direction or the Y direction, is acquired when the XYθ table 6 is moved by the predetermined movement amount.

On the other hand, the control computer 30 recognizes that the position misalignment amount is larger than the first acceptable value in a case where no optical image of the second rough alignment pattern is acquired when the XYθ table 6 is moved by the predetermined movement amount.

A more specific example of the rough alignment will be explained associated with a pattern inspection method described later.

Figure 4:
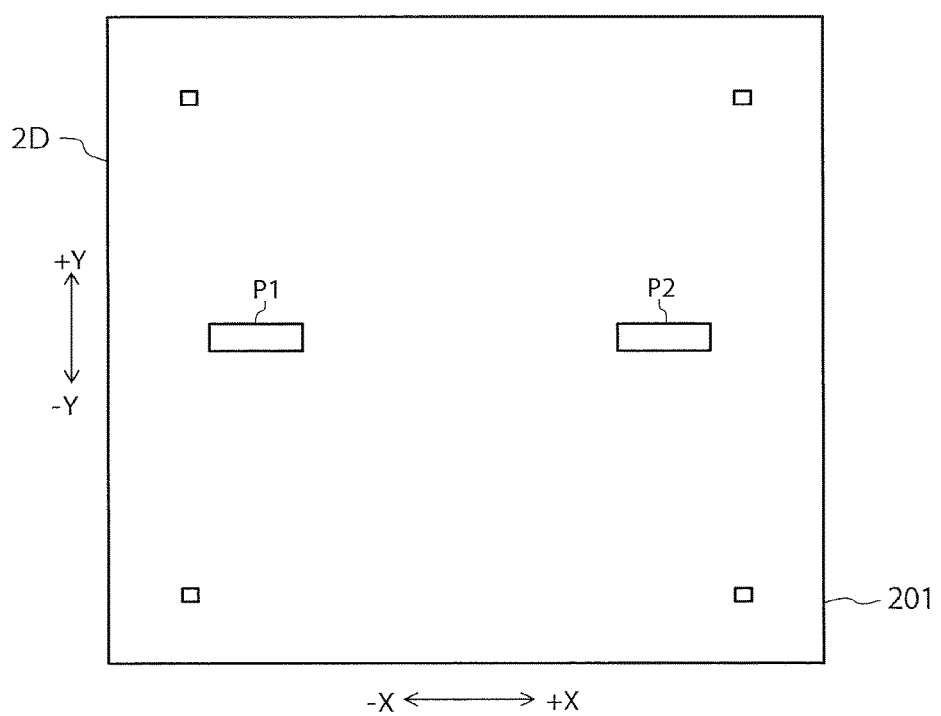
FIG. 4 is a plan view illustrating an example of rough alignment patterns in the pattern inspection method according to the first embodiment.

In the first embodiment, the first rough alignment pattern and the second rough alignment pattern used for the rough alignment are unique two patterns set by a user as patterns that can be distinguished from other patterns among the patterns on the mask 2. An example of the first rough alignment pattern and the second rough alignment pattern are a set of patterns that are separated from each other in the X-axis direction and that have substantially same coordinates in the Y-axis direction as illustrated in FIG. 4. These first and second rough alignment patterns in the first embodiment are previously set in the control computer 30 by a user that inputs position coordinate information of respective specific points of the first rough alignment pattern and the second rough alignment pattern using a keyboard, or the like, on the basis of the design data of the mask 2.

An operation of setting the first rough alignment pattern and the second rough alignment pattern is performed, for example, by a user that designates coordinates of the first rough alignment pattern and the second rough alignment pattern from the patterns on the design data of the mask 2 displayed by means of a display function (a monitor or the CRT 34, for example) of the control computer 30, using an input function (a man-machine interface such as a keyboard or a pointing device, for example) of the control computer 30. More specifically, an external computer 200 that operates with a program different from an execution program of the pattern inspection apparatus 1 is connected between the control computer 30 and the magnetic disk device 31. The coordinates of the first rough alignment pattern and the second rough alignment pattern are input from the control computer 30 to the external computer 200. The external computer 200 sets the first rough alignment pattern and the second rough alignment pattern, the coordinates of which have been input from the control computer 30. That is, the external computer 200 transmits the coordinates of the first rough alignment pattern and the second rough alignment pattern input from the control computer 30 to the pattern inspection apparatus 1 and instructs the control computer 30 to acquire image data of the first rough alignment pattern and the second rough alignment pattern from the pattern inspection apparatus 1. The image data of the first rough alignment pattern and the second rough alignment pattern acquired by the pattern inspection apparatus 1 are captured in the control computer 30.

In this way, the control computer 30 can acquire the image data of the first rough alignment pattern and the second rough alignment pattern set based on the design data of the mask 2 and perform the rough alignment described above.

The control computer 30 acquires optical images of patterns to be used for the fine alignment when it has been confirmed by the rough alignment that the position misalignment in the rotation direction of the mask 2 with respect to the X-axis direction or the Y-axis direction is equal to or smaller than the first acceptable value.

The patterns to be used for the fine alignment are hereinafter referred to as "fine alignment patterns".

The fine alignment is processing of correcting the position misalignment in the rotation direction of the mask 2 with respect to the X-axis direction or the Y-axis direction. More specifically, the fine alignment is processing of rotating the XYθ table 6 until the position misalignment amount in the rotation direction of the mask 2 with respect to the X-axis direction or the Y-axis direction, having been measured by the laser length measurement system 11, becomes equal to or smaller than a second acceptable value that is smaller than the first acceptable value.

The fine alignment patterns used for the fine alignment are patterns (see signs PP1 and PP2 in FIG. 8) that have a positional relation being positioned on a plurality of different corners of a virtual rectangular frame (see sign f in FIG. 8) constituted of four sides along the X direction or the Y direction in the inspection region 201 on the optical image of the mask 2.

In the first embodiment, in order to acquire optical images of the fine alignment patterns, the control computer 30 first acquires a plurality of patterns that have a positional relation being positioned on different corners of a virtual rectangular frame constituted of four sides along the X direction or the Y direction on the design data of the mask 2 as a plurality of fine alignment patterns. The control computer 30 then registers relative coordinates of specific points of the acquired fine alignment patterns based on the coordinates of a specific point of the first rough alignment pattern.

The rectangular frame is a square or a rectangle having sides parallel to the X direction and sides parallel to the Y direction.

The control computer 30 can acquire two patterns positioned at two corners separated in the X direction among the four corners of the rectangular frame as the fine alignment patterns and acquire two patterns positioned on the remaining two corners separated in the Y direction from the fine alignment patterns, respectively, as alignment marks for adjusting an expansion/contraction ratio of the optical image of the mask 2.

The control computer 30 then causes the table control circuit 17 to move the XYθ table 6 on the basis of the registered coordinates of each of the fine alignment patterns until the fine alignment pattern is positioned on the optical path of the light source 3. Around that time, the control computer 30 causes the autofocus control circuit 18 to perform autofocus for imaging the fine alignment pattern. The control computer 30 then acquires an optical image that is obtained by imaging the fine alignment pattern from the sensor circuit 19.

In this way, the control computer 30 can acquire optical images of the fine alignment patterns positioned on different corners of a rectangular frame.

Further, the control computer 30 detects a position misalignment amount in the rotation direction of the mask 2 with respect to the X-axis direction or the Y-axis direction on the basis of the acquired optical images of the fine alignment patterns. The control computer 30 then performs the fine alignment on the optical image of the mask 2 by rotating the XYθ table 6 in the θ direction until the detected position misalignment amount becomes equal to or smaller than the second acceptable value that is smaller than the first acceptable value.

With the control computer 30 having the configuration described above, the rough alignment can be performed based on unique first and second rough alignment patterns set by a user and the fine alignment can be performed based on fine alignment patterns positioned on different corners of a virtual rectangular frame along the X direction and the Y direction.

Accordingly, for example, a position misalignment in the rotation direction of the mask 2 with respect to the X direction can be detected based on the positional relation between two fine alignment patterns positioned on two corners of the rectangular frame separated in the X direction. As a result, automatic alignment can be performed appropriately to the mask 2 on which no specific pattern (for example, a cross-shaped pattern) dedicated to the automatic alignment is formed. Further, for example, the expansion/contraction ratio of the optical image of the mask 2 can be adjusted appropriately using two alignment marks positioned on the remaining two corners of the rectangular frame respectively separated in the Y direction from the two fine alignment patterns.

As described above, with the pattern inspection apparatus according to the first embodiment, whether the position misalignment amount in the rotation direction of the mask 2 with respect to the X-axis direction or the Y-axis direction is equal to or smaller than the first acceptable value can be confirmed by the rough alignment using unique first and second rough alignment patterns set by a user. When it has been confirmed that the position misalignment is equal to or smaller than the first acceptable value, the position misalignment in the rotation direction of the mask 2 with respect to the X-axis direction or the Y-axis direction can be corrected by the fine alignment using fine alignment patterns positioned on corners of a rectangular frame constituted of four sides along the X direction or the Y direction so as to cause the position misalignment to become equal to or smaller than the second acceptable value that is smaller than the first acceptable value. Accordingly, automatic alignment can be performed appropriately without the need of a specific pattern and thus the versatility of the automatic alignment can be improved.

(Pattern Inspection Method)

Figure 2:
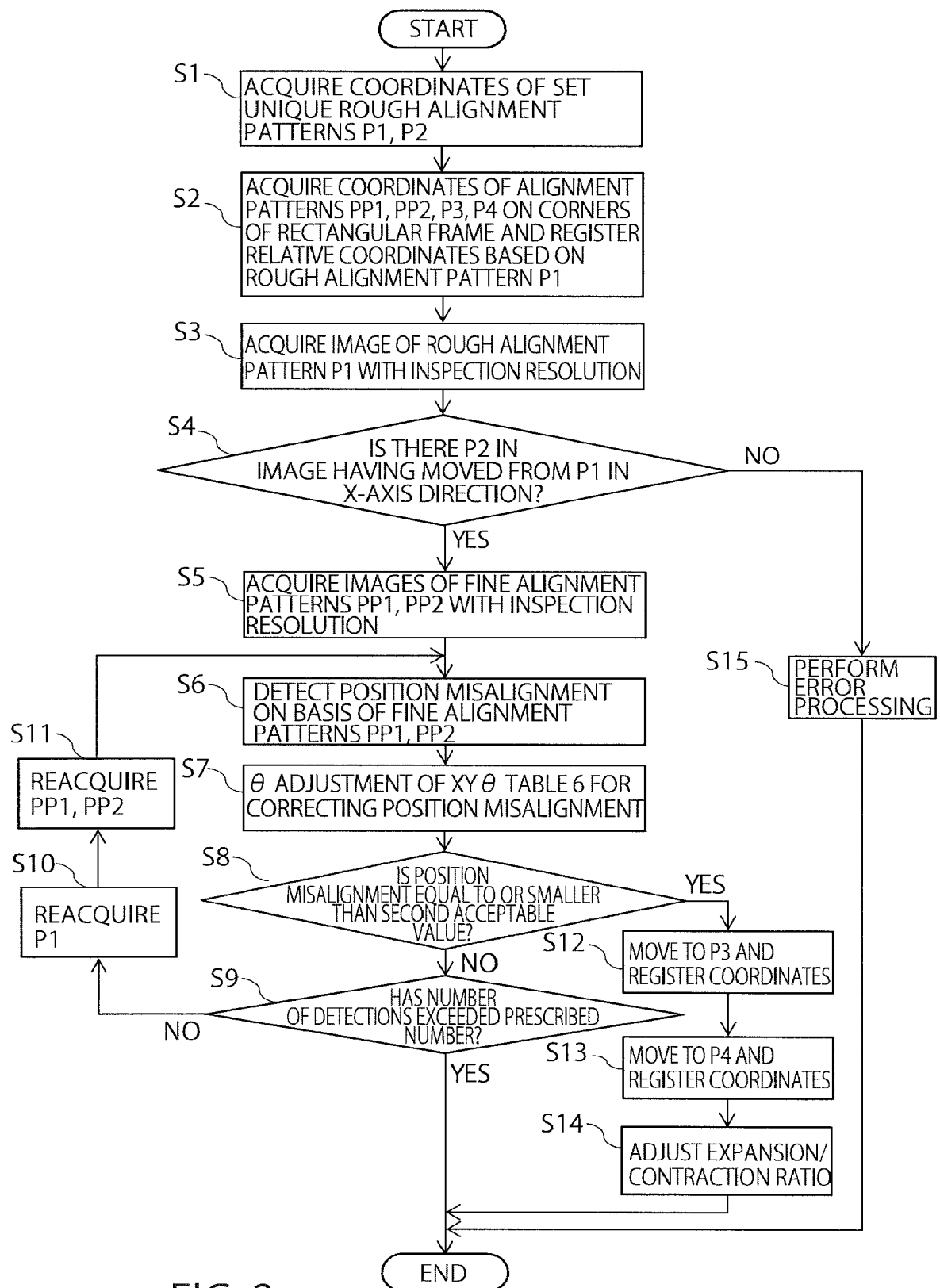
FIG. 2 is a flowchart illustrating a pattern inspection method according to the first embodiment.
Figure 3:
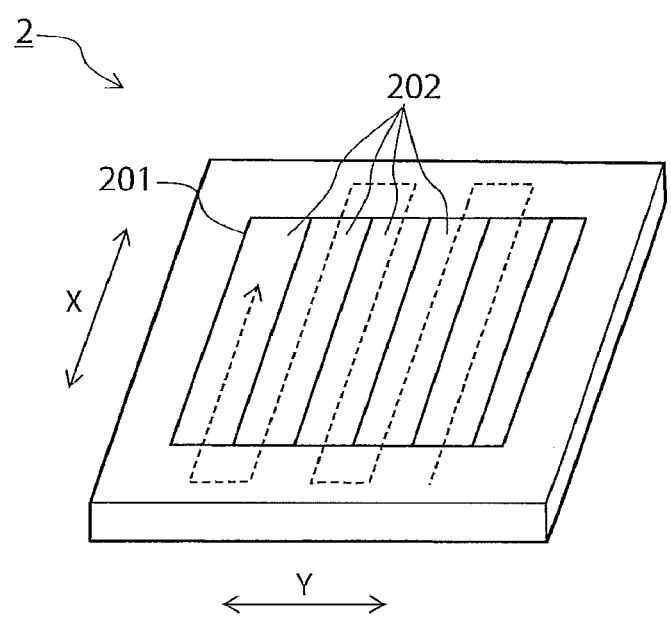
FIG. 3 is a perspective view illustrating the pattern inspection method according to the first embodiment.

A pattern inspection method according to the first embodiment, to which the pattern inspection apparatus 1 illustrated in FIG. 1 is applied, is explained next. FIG. 2 is a flowchart illustrating the pattern inspection method according to the first embodiment. The flowchart of FIG. 2 is repeated as required. FIG. 3 is a perspective view illustrating the pattern inspection method according to the first embodiment. As illustrated in FIG. 3, the inspection region 201 on the mask 2 is virtually divided into the stripes 202 of a strip shape. The photodiode array 8 takes an image of the mask 2 for each of the stripes 202 with movement of the XYθ table 6. At this time, the table control circuit 17 controls the operation of the XYθ table 6 to enable the stripes 202 to be sequentially scanned in a direction indicated by a dashed line arrow in FIG. 3. While the XYθ table 6 is moved, defects of patterns on the stripes 202 are inspected based on the optical images taken by the photodiode array 8.

In order to inspect defects, the control computer 30 performs automatic alignment of the mask 2 loaded onto the XYθ table 6 by the autoloader 9.

FIG. 4 is a plan view illustrating an example of a first rough alignment pattern P1 and a second rough alignment pattern P2 on design data 2D of the mask 2 in the pattern inspection method according to the first embodiment. Specifically, the control computer 30 first executes a program different from a program of the pattern inspection apparatus 1 to acquire the coordinates of the first rough alignment pattern P1 and the second rough alignment pattern P2 previously set on the design data 2D of the mask 2 as illustrated in FIGS. 2 and 4 (Step S1). The external computer 200 illustrated in FIG. 1 can be used for setting of the rough alignment patterns P1 and P2.

FIG. 4 illustrates the first rough alignment pattern P1 and the second rough alignment pattern P2 provided with a space apart from each other in the X direction as an example. The rough alignment patterns P1 and P2 are set as unique patterns that can be distinguished from other patterns by a user among patterns provided in the inspection region 201 of the mask 2.

The coordinates of the rough alignment patterns P1 and P2 are acquired, for example, by an automatic analysis of a layout analyzer that analyzes the design data 2D. It is preferable that a difference between the coordinates in the Y direction of the two rough alignment patterns P1 and P2 be small and it is more preferable that the coordinates in the Y direction thereof be equal to each other. While the horizontal direction of FIG. 4 is the X direction and the vertical direction thereof is the Y direction in the example illustrated in FIG. 4, the horizontal direction can be the Y direction and the vertical direction can be the X direction.

Figure 5:
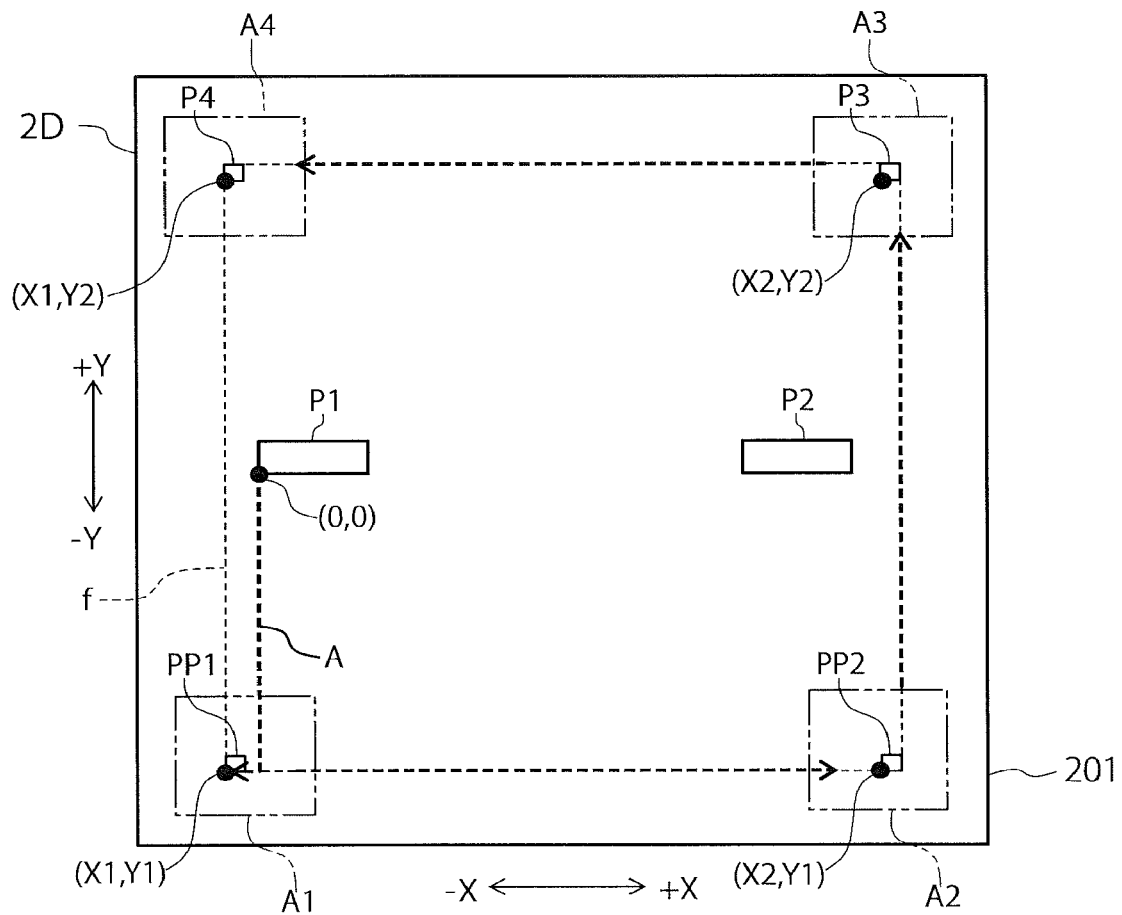
FIG. 5 is a plan view illustrating a process of acquiring four alignment patterns on corners of a rectangular frame including fine alignment patterns in the pattern inspection method according to the first embodiment.

FIG. 5 is a plan view illustrating a process of acquiring four alignment patterns PP1, PP2, P3, and P4 on corners of a rectangular frame f including fine alignment patterns PP1 and PP2 in the pattern inspection method according to the first embodiment. After acquiring the coordinates of the rough alignment patterns P1 and P2, the control computer 30 acquires specific coordinates (alignment points) of the four alignment patterns PP1, PP2, P3, and P4 that have a positional relation being positioned on different corners of the rectangular frame f constituted of four sides along the X direction or the Y direction on the design data 2D of the mask 2 (Step S2) as illustrated in FIGS. 2 and 5. Among the four alignment patterns PP1, PP2, P3, and P4, two alignment patterns PP1 and PP2 separated from each other in the X direction are the fine alignment patterns PP1 and PP2 to be used for the fine alignment. The remaining two alignment patterns P3 and P4 respectively separated in the Y direction from the fine alignment patterns PP1 and PP2 are alignment patterns P3 and P4 to be used for adjustment of the expansion/contraction ratio of the optical image of the mask 2.

The control computer 30 registers respective relative coordinates of the acquired four alignment patterns PP1, PP2, P3, and P4 based on the coordinates of the first rough alignment pattern P1 (Step S2).

Specifically, in the example illustrated in FIG. 5, the control computer 30 sets specific coordinates of the first rough alignment pattern P1 on a lower left end in FIG. 5 on the design data 2D of the mask 2 as a coordinate point (0, 0) of the first rough alignment pattern P1 and then searches for a first fine alignment pattern positioned within a certain distance from the coordinate point (0, 0) in a −Y direction and a −X direction. Due to this search of the first fine alignment pattern PP1 positioned within a certain distance from the first rough alignment pattern, the first fine alignment pattern PP1 can be retrieved promptly and therefore the automatic alignment can be performed promptly.

At the time of the search of the first fine alignment pattern, the control computer 30 searches, for example, a region A1 in a certain range at a lower left corner of the preset inspection region 201 as a search region for the first fine alignment pattern PP1 as illustrated in FIG. 5.

When the first fine alignment pattern PP1 is retrieved, the control computer 30 registers relative coordinates (X1, Y1) of the first fine alignment pattern PP1 based on the coordinate point (0, 0) of the first rough alignment pattern P1.

After registering the relative coordinates (X1, Y1) of the first fine alignment pattern PP1, the control computer 30 searches for a second fine alignment pattern PP2 that has a Y coordinate equal to that of the first fine alignment pattern PP1 in the +X direction. At this time, the control computer 30 searches, for example, a region A2 in a certain range at a lower right corner of the preset inspection region 201 as a search region for the second fine alignment pattern PP2 as illustrated in FIG. 5.

When the second fine alignment pattern PP2 is retrieved, the control computer 30 registers relative coordinates (X2, Y1) of the second fine alignment pattern PP2 based on the coordinate point (0, 0) of the first rough alignment pattern P1.

After registering the relative coordinates (X2, Y1) of the second fine alignment pattern PP2, the control computer 30 searches for a third alignment pattern P3 that has an X coordinate equal to that of the second fine alignment pattern PP2 in the +Y direction. At this time, the control computer 30 searches, for example, a region A3 in a certain range at an upper right corner of the preset inspection region 201 as a search region for the third alignment pattern P3 as illustrated in FIG. 5.

When the third alignment pattern P3 is retrieved, the control computer 30 registers relative coordinates (X2, Y2) of the third alignment pattern P3 based on the coordinate point (0, 0) of the first rough alignment pattern P1.

After registering the relative coordinates (X2, Y2) of the third alignment pattern P3, the control computer 30 searches for a four alignment pattern P4 that has a Y coordinate equal to that of the third alignment pattern P3 and an X coordinate equal to that of the first fine alignment pattern PP1 in the −X direction. At this time, the control computer 30 searches, for example, a region A4 in a certain range at an upper left corner of the preset inspection region 201 as a search region for the fourth alignment pattern P4 as illustrated in FIG. 5.

When the fourth alignment pattern P4 is retrieved, the control computer 30 registers relative coordinates (X1, Y2) of the fourth alignment pattern P4 based on the coordinate point (0, 0) of the first rough alignment pattern P1.

In the manner described above, the four alignment patterns PP1, PP2, P3, and P4 that have a positional relation being respectively positioned on the corners of the rectangular frame f on the design data 2D of the mask 2 are acquired.

Figure 6:
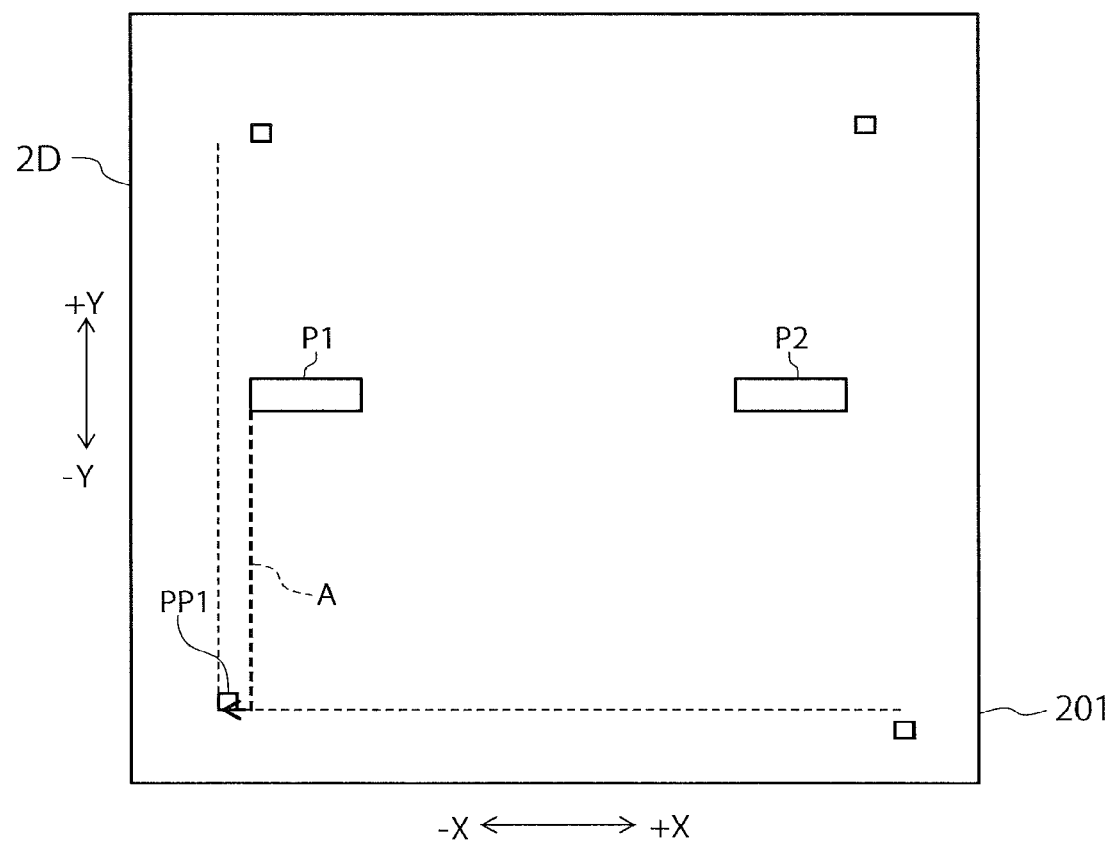
FIG. 6 is a plan view illustrating an example in which four alignment patterns cannot be acquired in the pattern inspection method according to the first embodiment.

FIG. 6 is a plan view illustrating an example in which four alignment patterns PP1, PP2, P3, and P4 cannot be acquired in the pattern inspection method according to the first embodiment.

In the example illustrated in FIG. 5, the four alignment patterns PP1, PP2, P3, and P4 are successfully acquired. In contrast thereto, in some design data 2D as illustrated in FIG. 6, four alignment patterns are not arranged to be positioned on the corners of a rectangular frame f as illustrated in FIG. 5, which prevents acquisition of four alignment patterns PP1, PP2, P3, and P4. In this case, an error stop of the inspection is performed or, when there is a specific pattern similar to a conventional one in the inspection region 201, the alignment is switched to one using the specific pattern.

Figure 7:
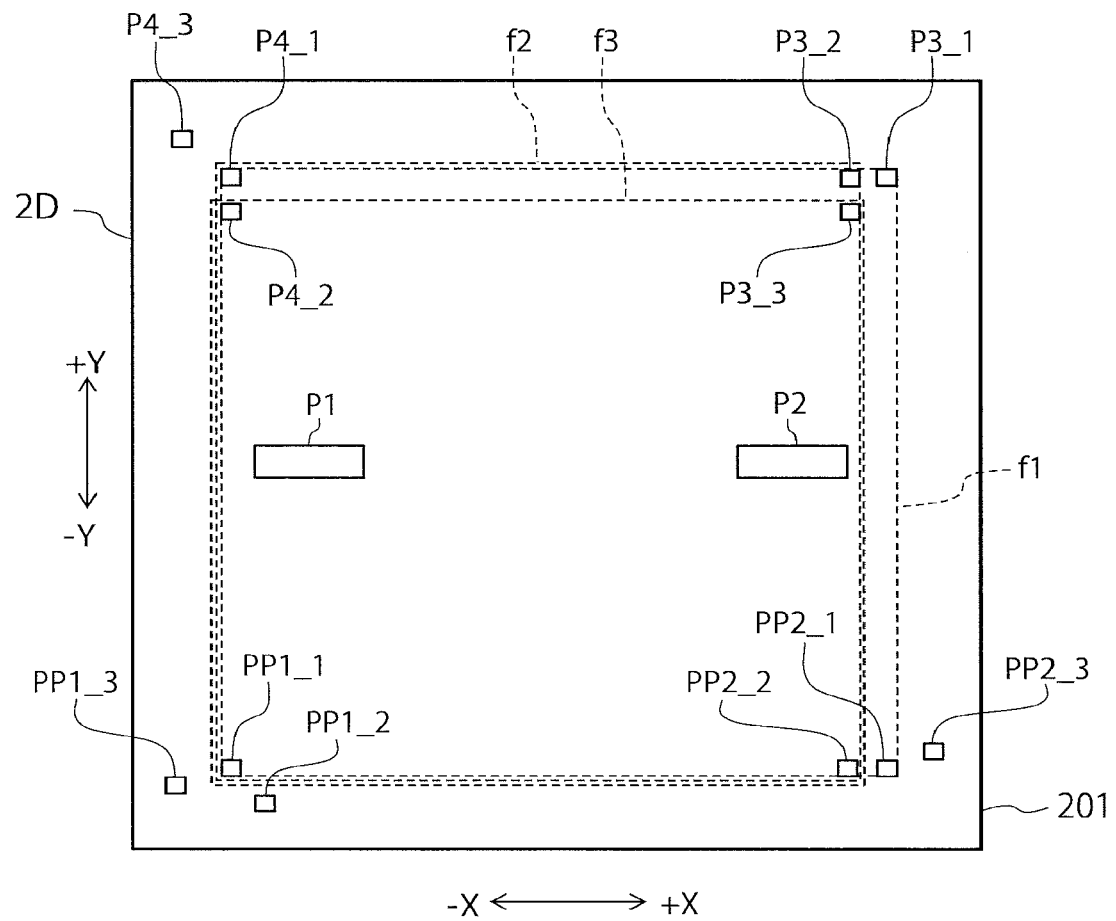
FIG. 7 is a plan view illustrating a process of acquiring four alignment patterns on corners of a largest rectangular frame in the pattern inspection method according to the first embodiment.

FIG. 7 is a plan view illustrating a process of acquiring four alignment patterns PP1_1, PP2_1, P3_1, and P4_1 on a largest rectangular frame f1 in the pattern inspection method according to the first embodiment. In the example illustrated in FIG. 5, a set of alignment patterns PP1, PP2, P3, and P4 are acquired as four alignment patterns PP1, PP2, P3, and P4 positioned on the rectangular frame f.

In contrast thereto, in some design data 2D, plural sets of four alignment patterns positioned on corners of a plurality of rectangular frames f1 to f3, respectively, are acquired as illustrated in FIG. 7. In this case, it suffices to acquire the four alignment patterns PP1_1, PP2_1, P3_1, and P4_1 positioned on the corners of the largest rectangular frame f1 that extends to an outermost position in the inspection region 201 among the rectangular frames f1 to f3 to be used for the fine alignment or adjustment of the expansion/contraction ratio. Such use of the fine alignment patterns PP1_1 and PP2_1 positioned on the corners of the rectangular frame f1 positioned on the outermost side on the mask 2 among the rectangular frames f1 to f3 for the fine alignment can improve the accuracy of θ adjustment in the fine alignment, which will be described later.

Figure 8:
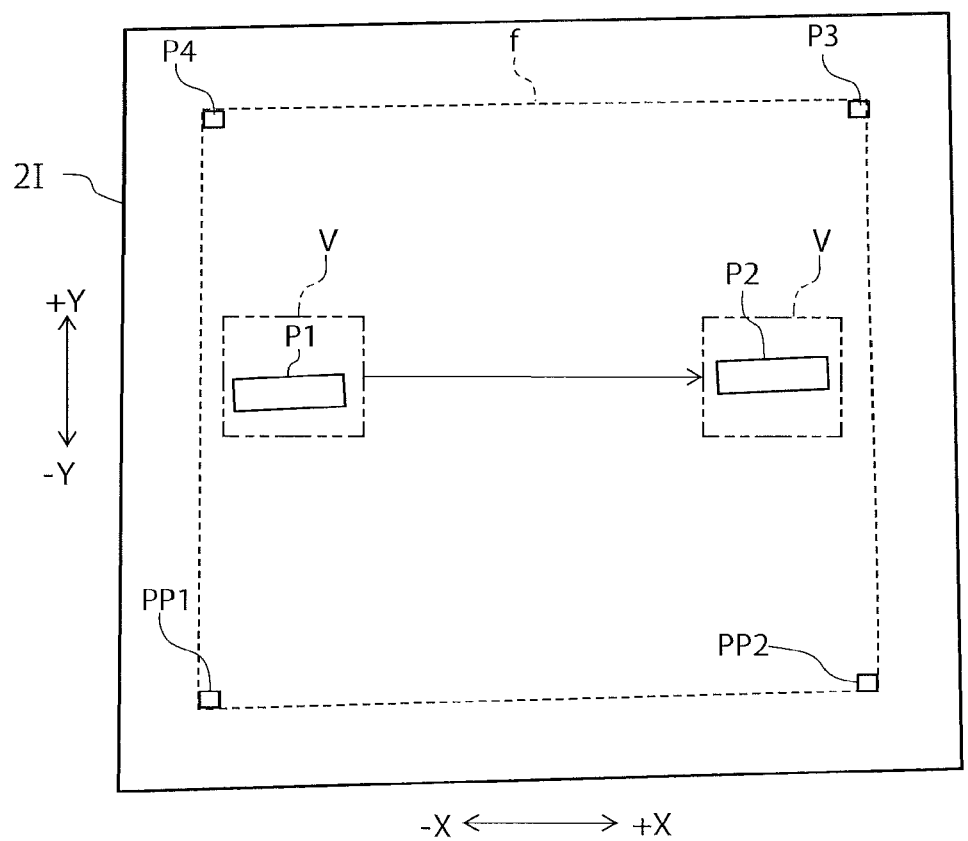
FIG. 8 is a plan view illustrating a rough alignment process in the pattern inspection method according to the first embodiment, continuous from FIG. 5.

FIG. 8 is a plan view illustrating a rough alignment process in the pattern inspection method according to the first embodiment, continuous from FIG. 5. After the four alignment patterns PP1, PP2, P3, and P4 are acquired, the control computer 30 performs the rough alignment on an optical image 21 of the mask 2 on the basis of the acquired rough alignment patterns P1 and P2 (Steps S3 and S4).

Specifically, in the rough alignment, the control computer 30 first acquires an optical image of the first rough alignment pattern P1 with an inspection resolution being a highest magnification of the pattern inspection apparatus 1 as illustrated in FIGS. 2 and 8 (Step S3).

In the example illustrated in FIG. 8, the control computer 30 causes the table control circuit 17 to move the XYθ table 6 until the first rough alignment pattern P1 is positioned on the optical path of the light source 3. Around that time, the control computer 30 causes the autofocus control circuit 18 to perform autofocus for imaging the mask 2 with the inspection resolution and then images the mask 2.

Accordingly, an optical image of the first rough alignment pattern P1 with the inspection resolution having an imaging range enclosed by a view V in FIG. 8 is acquired.

After the optical image of the first rough alignment pattern P1 is acquired, the control computer 30 causes the table control circuit 17 to move the XYθ table 6 in the −X direction in such a manner that the view V moves in the +X direction. A movement amount of the XYθ table 6 at this time is a movement amount corresponding to the distance between the rough alignment patterns P1 and P2 on the design data 2D of the mask 2.

The control computer 30 then determines whether there is the second rough alignment pattern P2 in an optical image after the movement of the view V in the +X direction from the first rough alignment pattern P1 (Step S4).

When there is the second rough alignment pattern P2 (YES at Step S4), the rough alignment is determined to be successful and therefore it is confirmed that the position misalignment amount in the rotation direction of the mask 2 with respect to the X-axis direction is equal to or smaller than the first acceptable value. In the example illustrated in FIG. 8, the first acceptable value is a position misalignment to such an extent that enables the second rough alignment pattern P2 having the same Y coordinate as that of the first rough alignment pattern P1 to be detected in the view V having moved in the +X direction on the design data 2D.

On the other hand, when there is not the second rough alignment pattern P2 (NO at Step S4), the rough alignment is determined as a failure and it is therefore confirmed that the position misalignment of the mask 2 in the rotation direction of the XYθ table 6 with respect to the X-axis direction is larger than the first acceptable value.

As illustrated in FIG. 8, the optical image 21 of the mask 2 before the automatic alignment is an optical image 21 having an inclination or distortion with respect to the X direction or the Y direction caused by an inclination or position misalignment of the mask 2 in the θ direction or the Z direction on the XYθ table 6. If defects of patterns are inspected using the optical image 21 having such an inclination or distortion as it is, it is difficult to appropriately inspect the defects.

In contrast thereto, according to the rough alignment illustrated in FIG. 8, whether the position misalignment amount in the rotation direction of the mask 2 with respect to the X-axis direction is equal to or smaller than the first acceptable value can be confirmed. Therefore, execution of the defect inspection on patterns using the optical image 21 having a large inclination in the 6 direction can be prevented from occurring. In the example of FIG. 8, the first rough alignment pattern P1 and the second rough alignment pattern P2 arranged to be separated from each other in the X-axis direction are set as two patterns to be used for the rough alignment. However, two patterns arranged to be separated from each other in the Y-axis direction can be set as two patterns to be used for the rough alignment. When the rough alignment using two patterns arranged to be separated from each other in the Y-axis direction is performed, whether a position misalignment amount in the rotation direction of the mask 2 with respect to the Y-axis direction is equal to or smaller than the first acceptable value can be confirmed.

Figure 9:
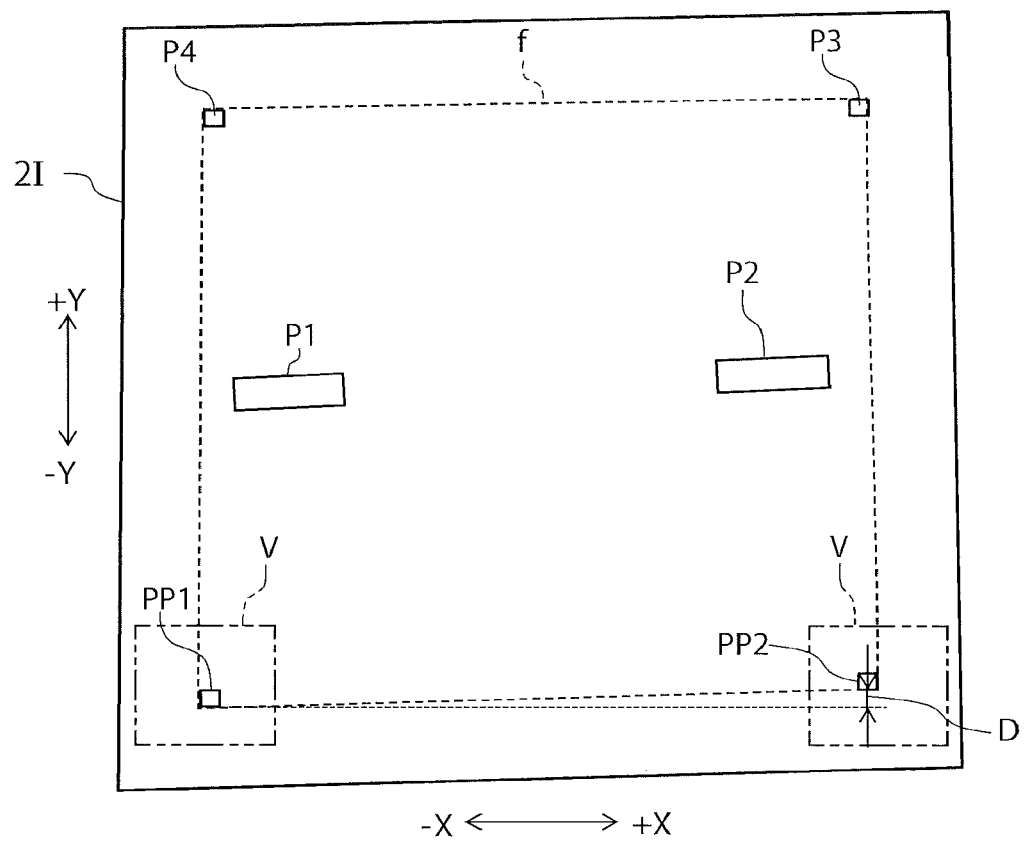
FIG. 9 is a plan view illustrating a process of measuring a position misalignment of a fine alignment pattern in fine alignment by the pattern inspection method according to the first embodiment, continuous from FIG. 8.

FIG. 9 is a plan view illustrating a process of measuring a position misalignment D of the fine alignment pattern PP1 or PP2 in the fine alignment by the pattern inspection method according to the first embodiment, continuous from FIG. 8.

When it has been confirmed by the rough alignment that the position misalignment amount in the rotation direction of the mask 2 with respect to the X-axis direction is equal to or smaller than the first acceptable value (YES at Step S4), the control computer 30 performs fine alignment on the optical image 21 of the mask 2 on the basis of the acquired fine alignment patterns PP1 and PP2 (Steps S5 to S10).

On the other hand, when it has been confirmed by the rough alignment that the position misalignment amount in the rotation direction of the mask 2 with respect to the X-axis direction is larger than the first acceptable value (NO at Step S4), the control computer 30 performs error processing (Step S15). The error processing is, for example, reload of the mask 2.

In the fine alignment, the control computer 30 first acquires optical images of the fine alignment patterns PP1 and PP2 with the inspection resolution (Step S5). In the same manner as the acquisition of those of the rough alignment patterns P1 and P2, for example, the control computer 30 sequentially acquires the optical images of the fine alignment patterns PP1 and PP2 in a range enclosed by the view V as illustrated in FIG. 9.

After the optical images of the fine alignment patterns PP1 and PP2 are acquired, the control computer 30 detects a position misalignment amount D in the rotation direction of the mask 2 with respect to the X-axis direction, having been measured by the laser length measurement system 11, on the basis of the acquired optical images of the fine alignment patterns PP1 and PP2 as illustrated in FIGS. 2 and 9 (Step S6). The position misalignment amount D is calculated, for example, as a difference between the Y coordinates of the two fine alignment patterns PP1 and PP2. The unit of the position misalignment amount D is pixel, for example.

Figure 10:
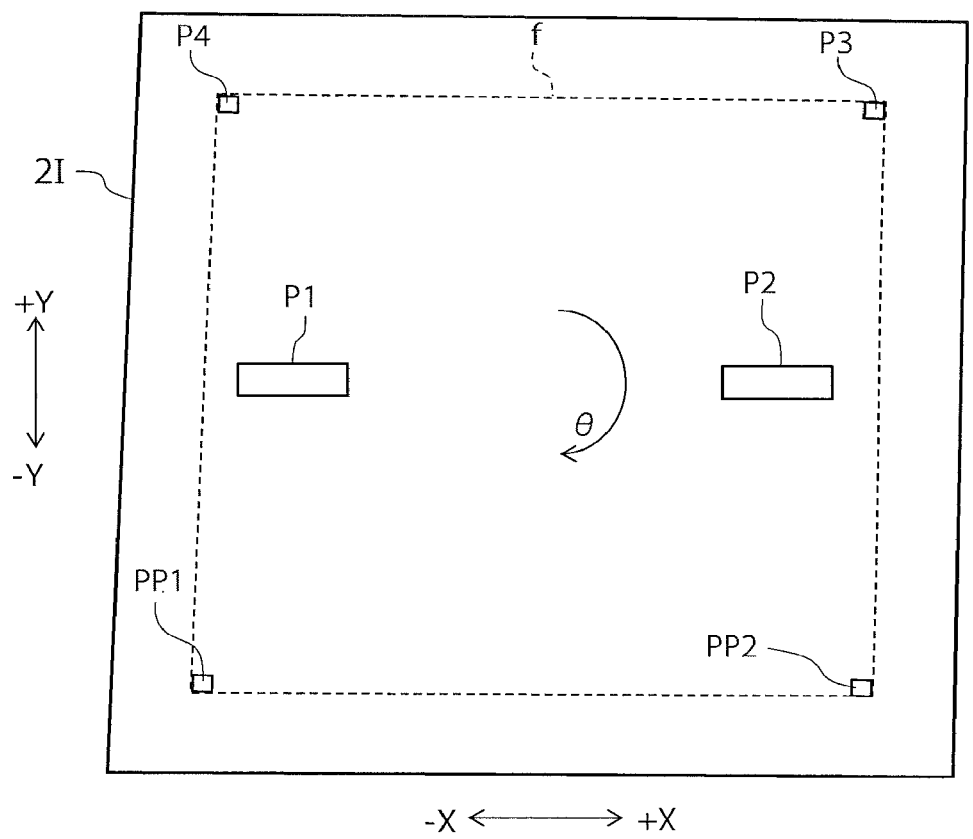
FIG. 10 is a plan view illustrating a process of rotating an XYθ table in fine alignment by the pattern inspection method according to the first embodiment, continuous from FIG. 9.

FIG. 10 is a plan view illustrating a process of rotating the XYθ table 6 in the fine alignment by the pattern inspection method according to the first embodiment, continuous from FIG. 9. After the position misalignment amount D is detected, the control computer 30 performs 0 adjustment of rotating the XYθ table 6 in the θ direction to cause the position misalignment amount D to become equal to or smaller than the second acceptable value as illustrated in FIGS. 2 and 10 (Step S7).

After performing the θ adjustment, the control computer 30 determines whether the position misalignment amount D after the θ adjustment is equal to or smaller than the second acceptable value as illustrated in FIG. 2 (Step S8).

When the position misalignment amount D is equal to or smaller than the second acceptable value (YES at Step S8), the control computer 30 proceeds to processing to adjust the expansion/contraction ratio of the optical image 21 of the mask 2 (Steps S12 to S14).

On the other hand, when the position misalignment amount D is not equal to or smaller than the second acceptable value (NO at Step S8), the control computer 30 determines whether the number of detections of the position misalignment amount D has exceeded a prescribed number of detections (Step S9).

When the number of detections has exceeded the prescribed number of detections (YES at Step S9), the control computer 30 ends the processing. On the other hand, when the number of detections has not exceeded the prescribed number of detections (NO at Step S9), the control computer 30 retries the fine alignment. Specifically, the control computer 30 reacquires an optical image of the first rough alignment pattern P1 by moving the view V to coordinates that are obtained by rotationally displacing the coordinates of the first rough alignment pattern P1 before subjected to the θ adjustment through the θ adjustment (Step S10).

After reacquiring the optical image of the first rough alignment pattern P1, the control computer 30 reacquires optical images of the fine alignment patterns PP1 and PP2 by moving the view V to the coordinates obtained by rotationally displacing the coordinates of the fine alignment patterns PP1 and PP2 before subjected to the θ adjustment through the θ adjustment (Step S11). After reacquiring the optical images of the fine alignment patterns PP1 and PP2, the control computer 30 repeats the processes after Step S6 on the basis of the reacquired optical images of the fine alignment patterns PP1 and PP2.

In the processing to adjust the expansion/contraction ratio of the optical image 21 of the mask 2 (Steps S12 to S14), the control computer 30 first moves the XYθ table 6 in the −Y direction to move the view V onto the third alignment pattern P3, thereby detecting the third alignment pattern P3. The control computer 30 then registers coordinates of the detected third alignment pattern P3 (Step S12).

After registering the coordinates of the third alignment pattern P3, the control computer 30 moves the XYθ table 6 in the +X direction to move the view V onto the fourth alignment pattern P4, thereby detecting the fourth alignment pattern P4. The control computer 30 then registers coordinates of the detected fourth alignment pattern P4 (Step S13).

After registering the coordinates of the fourth alignment pattern P4, the control computer 30 adjusts the expansion/contraction ratio of the optical image 21 to cause the optical image 21 of the mask 2 to become a rectangle or a square on the basis of the coordinates of the alignment patterns PP1, PP2, P3, and P4 having been subjected to the θ adjustment (Step S14). By thus inspecting defects of the patterns using optical images where an inclination and a distortion has been corrected, the inspection can be performed accurately.

When performing the retry of the fine alignment descried above, the control computer 30 can reacquire an optical image of each of the fine alignment patterns PP1 and PP2 through a relative movement from the coordinates of a reacquired optical image of the first rough alignment pattern P1 on the basis of the relative coordinates previously registered. This configuration enables the retry of the fine alignment to be performed easily and appropriately even when the positions of the rough alignment pattern P1 and the fine alignment patterns PP1 and PP2 are changed due to rotation of the XYθ table 6.

As described above, according to the first embodiment, by performing the rough alignment using unique rough alignment patterns set by a user, and the fine alignment using fine alignment patterns positioned on corners of a rectangular frame, it is possible to perform automatic alignment in rotation of the XYθ table 6 even for the mask 2 having no specific pattern. Therefore, the versatility of the automatic alignment can be improved.

Second Embodiment

Figure 11:
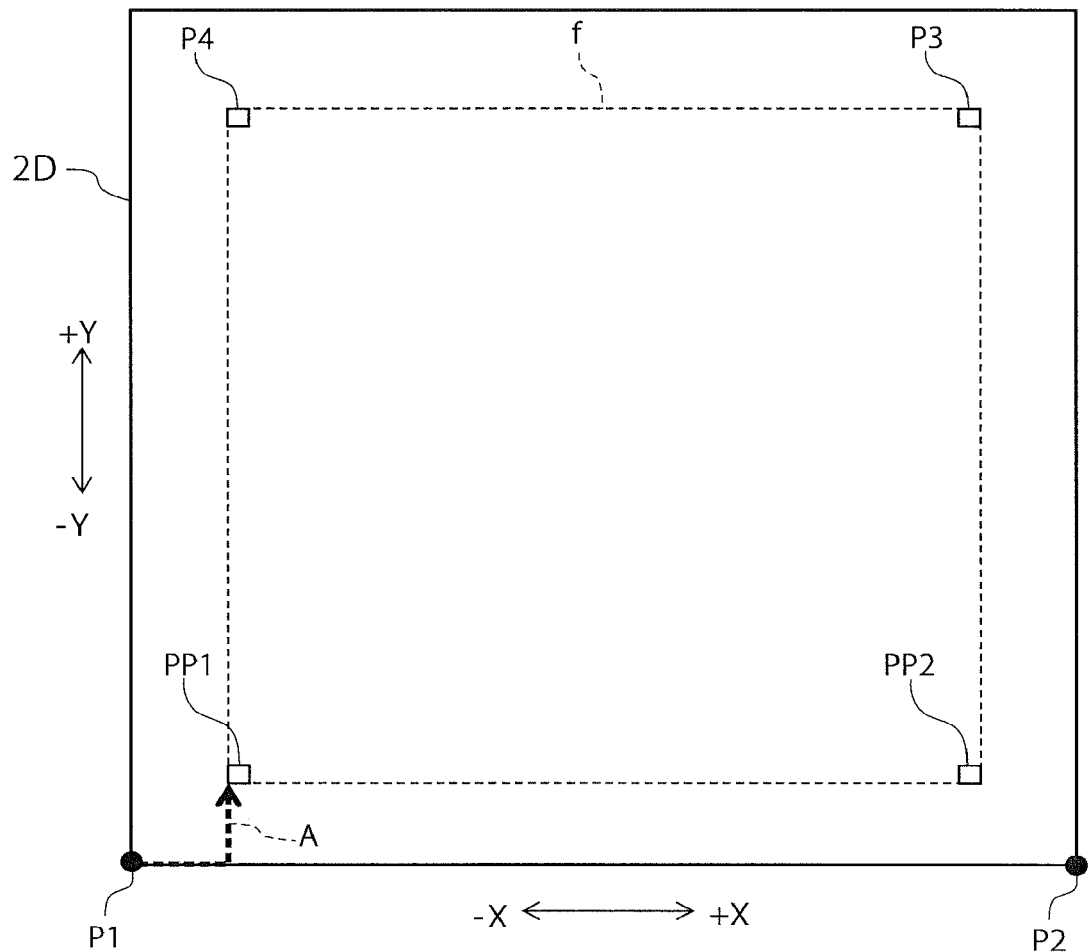
FIG. 11 is a plan view illustrating a pattern inspection method according to a second embodiment.

A second embodiment in which end parts of the mask 2 are used as the rough alignment patterns P1 and P2 is explained next. FIG. 11 is a plan view illustrating a pattern inspection method according to the second embodiment.

In the first embodiment, the automatic alignment is performed using the rough alignment patterns P1 and P2 in the inspection region 201 set by a user as unique patterns.

In contrast thereto, in the second embodiment, a lower left end of the mask 2 in FIG. 11 is set as the first rough alignment pattern P1 and a lower right end thereof is set as the second rough alignment pattern P2 on the design data 2D as illustrated in FIG. 11. Other configurations and effects of the second embodiment are identical to those of the first embodiment, and thus detailed descriptions thereof are omitted.

According to the second embodiment, with use of ends of the mask 2, the automatic alignment can be performed also when unique patterns are not found in the inspection region 201. Therefore, the versatility of the alignment can be improved more.

Third Embodiment

Figure 12:
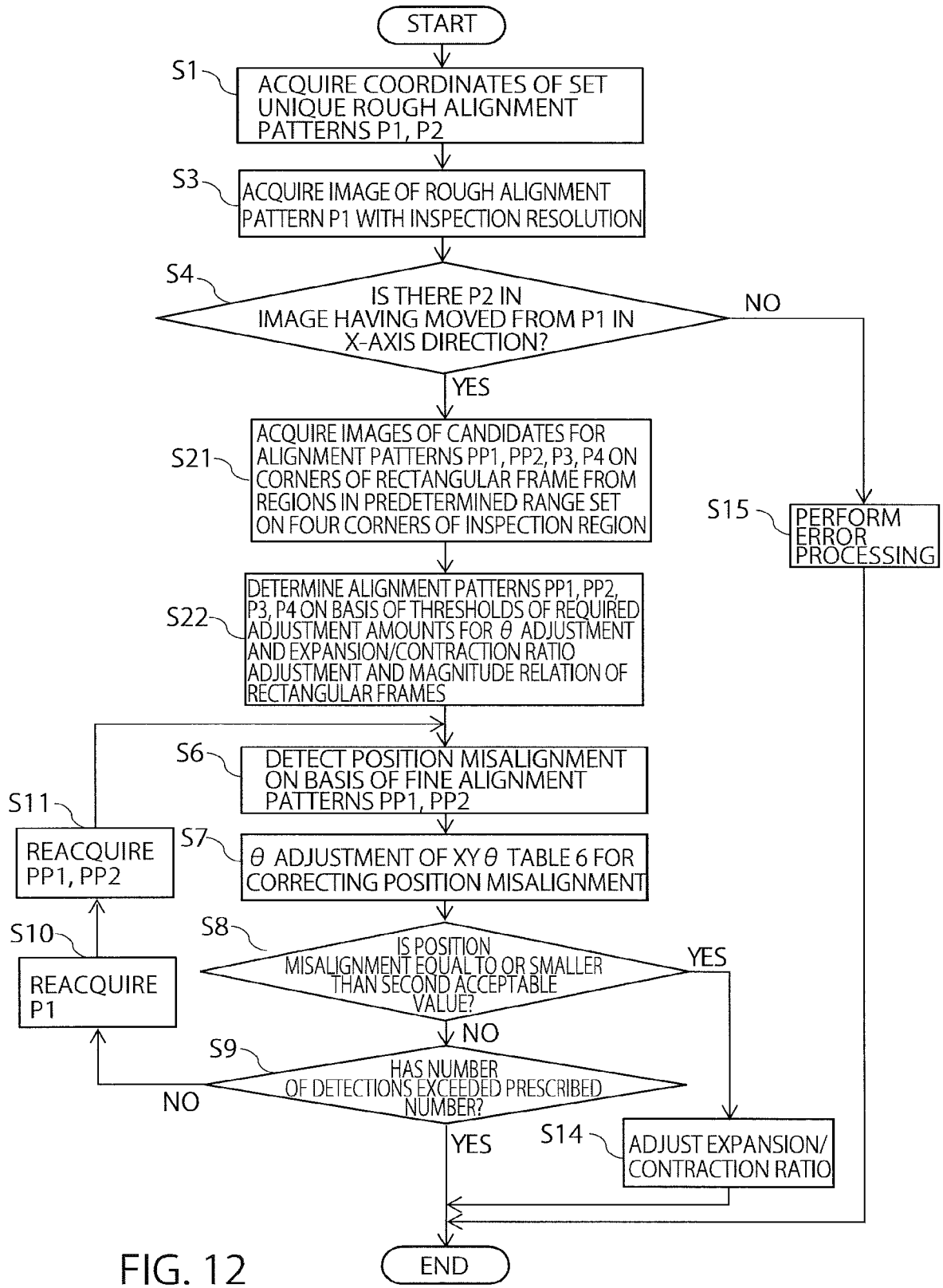
FIG. 12 is a flowchart illustrating a pattern inspection method according to a third embodiment.
Figure 13:
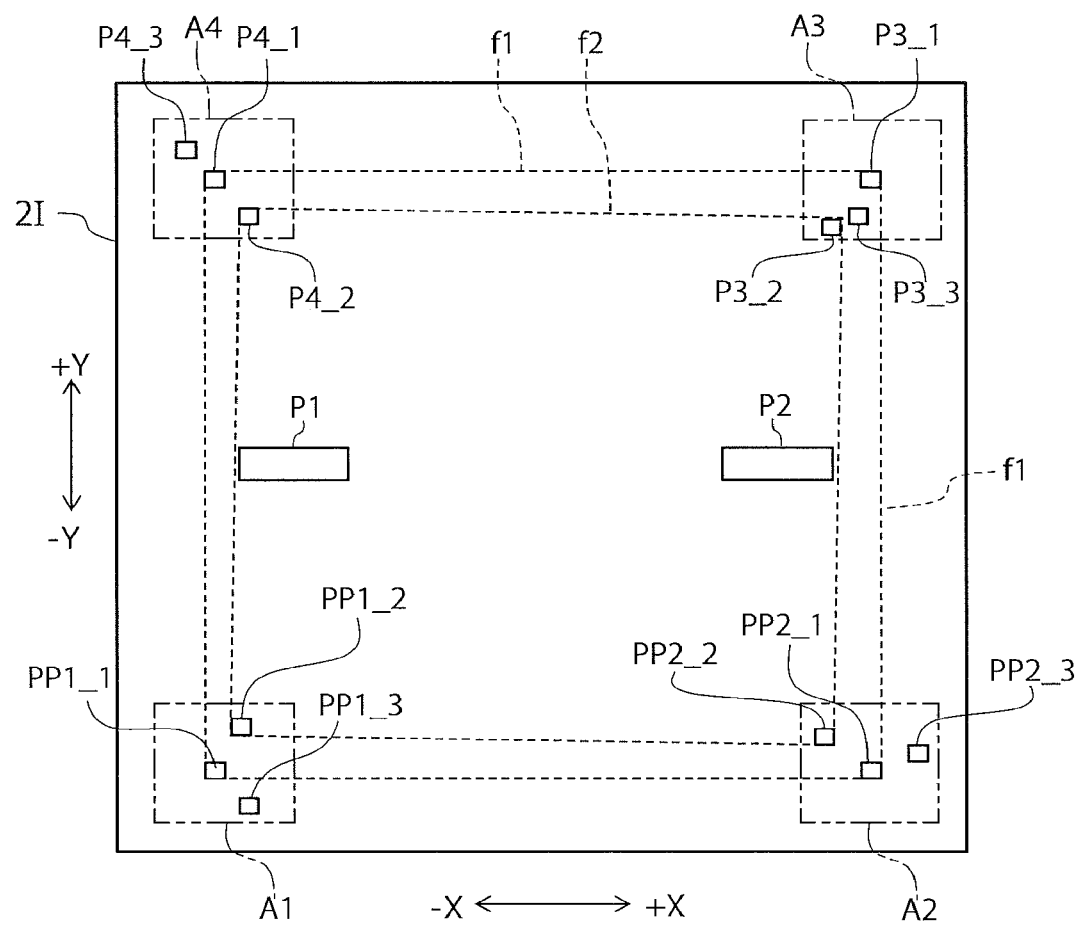
FIG. 13 is a plan view illustrating the pattern inspection method according to the third embodiment.

A third embodiment in which the alignment patterns PP1, PP2, P3, and P4 are set on the optical image 21 of the mask 2 is explained next mainly on differences from the first embodiment. FIG. 12 is a flowchart illustrating a pattern inspection method according to the third embodiment. FIG. 13 is a plan view illustrating the pattern inspection method according to the third embodiment.

In the third embodiment, as illustrated in FIGS. 12 and 13, when the rough alignment has been successfully performed (YES at Step S4), the control computer 30 acquires optical images of candidates for the four alignment patterns PP1, PP2, P3, and P4 that have a positional relation being positioned on the corners of a rectangular frame from regions A1 to A4 in a predetermined range set on four corners of the inspection region 201, respectively (Step S21).

In the example illustrated in FIG. 13, a set of alignment pattern candidates PP1_1, PP2_1, P3_1, and P4_1 that have a positional relation being positioned on the corners of the first rectangular frame f1, and a set of alignment pattern candidates PP1_2, PP2_2, P3_2, and P4_2 that have a positional relation being positioned on the corners of the second rectangular frame f2 are acquired as the candidates for the alignment patterns PP1, PP2, P3, and P4.

After acquiring the candidates for the alignment patterns PP1, PP2, P3, and P4, the control computer 30 determines one set of the acquired candidates as the alignment patterns PP1, PP2, P3, and P4 on the basis of respective thresholds of required adjustment amounts for the θ adjustment and the expansion/contraction ratio adjustment, and a magnitude relation of the rectangular frames (Step S22). Accordingly, the fine alignment patterns PP1 and PP2 are acquired on the basis of the optical image.

At this time, in order to compare with the respective thresholds, the control computer 30 performs the θ adjustment for each set of the alignment pattern candidates to obtain the required adjustment amount for the θ adjustment and performs the expansion/contraction ratio adjustment to obtain the required adjustment amount for the expansion/contraction ratio adjustment. When the required adjustment amounts for the θ adjustment and the expansion/contraction ratio adjustment are smaller than the respective thresholds, the control computer 30 determines that the alignment pattern candidates have an aptitude for the alignment patterns PP1, PP2, P3, and P4. The control computer 30 determines that the alignment pattern candidates have a higher aptitude for the alignment patterns PP1, PP2, P3, and P4 as the area of the rectangular frame is larger.

In the example of FIG. 13, the first rectangular frame f1 has a smaller inclination or distortion with respect to the X direction (that is, the required adjustment amount is smaller than the threshold) and has a larger area than the second rectangular frame f2. Therefore, in the example of FIG. 13, the alignment pattern candidates PP1_1, PP2_1, P3_1, and P4_1 on the corners of the first rectangular frame f1 are determined as the four alignment patterns PP1, PP2, P3, and P4.

After determining the alignment patterns PP1, PP2, P3, and P4, the control computer 30 performs the fine alignment (Steps S6 to S11) and the adjustment of the expansion/contraction ratio (Step S14) in the same manner as that in the first embodiment using the determined alignment patterns PP1, PP2, P3, and P4.

However, at the time of determination of the alignment patterns PP1, PP2, P3, and P4 (Step S22), the required adjustment amount for the θ adjustment is already obtained in the third embodiment. Therefore, the required adjustment amount for the θ adjustment having been obtained at the time of determination of the alignment patterns PP1, PP2, P3, and P4 can be used as the adjustment amount of the θ adjustment (Step S7) in the fine alignment.

At the time of acquiring the optical images of the alignment pattern candidates (Step S21), the third alignment pattern P3 and the fourth alignment pattern P4 are acquired in the third embodiment. Therefore, the third alignment pattern P3 and the fourth alignment pattern P4 having been acquired at the time of acquisition of the optical images of the alignment pattern candidates (Step S21) can be used to adjust the expansion/contraction ratio (Step S14). As the adjustment amount of the expansion/contraction ratio, the required adjustment amount for the expansion/contraction ratio having been obtained at the time of determination of the alignment patterns PP1, PP2, P3, and P4 (Step S22) can be used.

According to the third embodiment, the required adjustment amounts for the θ adjustment and the expansion/contraction ratio adjustment, which have been calculated at the time of determination of the alignment patterns PP1, PP2, P3, and P4, can be used in the θ adjustment and the expansion/contraction ratio adjustment. Therefore, the required time for the automatic alignment can be shortened.

Further, according to the third embodiment, the third alignment pattern P3 and the fourth alignment pattern P4 having been acquired at the time of acquisition of the optical images of the alignment pattern candidates can be used in adjustment of the expansion/contraction ratio. Therefore, the process of moving to the third alignment pattern P3 and the fourth alignment pattern P4 (Steps S12 and S13 in FIG. 2) as in the first embodiment is not required. This configuration further shortens the required time for the automatic alignment.

At least a part of the pattern inspection apparatus 1 can be constituted by hardware or software. When it is constituted by software, the pattern inspection apparatus 1 can be configured such that a program realizing the functions of at least a part of the pattern inspection apparatus 1 is stored in a recording medium such as a flexible disk or a CD-ROM, and the program is read and executed by a computer. The recording medium is not limited to a detachable device such as a magnetic disk or an optical disk, and can be a fixed recording medium such as a hard disk device or a memory.

The embodiments described above are presented for purposes of illustration only and are not intended to limit the scope of the invention. These embodiments can be also carried out in other various modes, and various types of omissions, replacements, and modifications can be made without departing from the spirit of the invention. These embodiments and modifications thereof are included in the spirit and scope of the invention, and are also included in the invention described in the appended claims and equivalents thereof.

The invention claimed is:

1. An inspection method of inspecting defects of patterns provided in an inspection region of a sample, using an inspection apparatus comprising a stage having an XY plane on which the sample can be placed and being movable in an X direction and a Y direction and rotatable on a Z axis substantially perpendicular to the XY plane, the method comprising:

performing rough alignment to confirm whether a position misalignment amount in a rotation direction of the sample with respect to the X direction or the Y direction is equal to or smaller than a first acceptable value; and performing fine alignment to correct the position misalignment amount to be equal to or smaller than a second acceptable value being smaller than the first acceptable value, wherein the performing of the rough alignment comprises acquiring an optical image of a first pattern on the inspection region of the sample, the first pattern being previously set as a pattern to be used for the rough alignment, moving the stage from a position of the stage at a time of acquisition of the optical image of the first pattern in the X direction or the Y direction by a predetermined movement amount, and recognizing that the position misalignment amount is equal to or smaller than the first acceptable value in a case where an optical image of a second pattern on the inspection region, the second pattern being previously set as a pattern to be used for the rough alignment and being positioned to be separated from the first pattern in the X direction or the Y direction, is acquired when the stage is moved by the movement amount, and recognizing that the position misalignment amount is larger than the first acceptable value in a case where an optical image of the second pattern is not acquired, and the performing of the fine alignment comprises acquiring optical images of a plurality of third patterns to be used for the fine alignment, the third patterns being respectively positioned on a plurality of different corners of a rectangular frame constituted of four sides along the X direction or the Y direction on the inspection region of an optical image of the sample when it is confirmed by the rough alignment that the position misalignment amount is equal to or smaller than the first acceptable value, detecting the position misalignment amount on a basis of the acquired optical images of the third patterns, and rotating the stage until the detected position misalignment amount becomes equal to or smaller than the second acceptable value.

2. The method of claim 1, wherein the third patterns are patterns positioned in a plurality of regions set at each of a plurality of corners of the inspection region and having an edge along at least one of the X direction and the Y direction.

3. The method of claim 1, wherein the performing of the fine alignment comprises reacquiring an optical image of the first pattern when the position misalignment amount has not become equal to or smaller than the second acceptable value in spite of the rotation of the stage, reacquiring optical images of the third patterns by a relative movement from the reacquired optical image of the first pattern, redetecting the position misalignment amount on a basis of the reacquired optical images of the third patterns, and rotating again the stage to cause the redetected position misalignment amount to become equal to or smaller than the second acceptable value.

4. The method of claim 2, wherein the performing of the fine alignment comprises reacquiring an optical image of the first pattern when the position misalignment amount has not become equal to or smaller than the second acceptable value in spite of the rotation of the stage, reacquiring optical images of the third patterns by a relative movement from the reacquired optical image of the first pattern, redetecting the position misalignment amount on a basis of the reacquired optical images of the third patterns, and rotating again the stage to cause the redetected position misalignment amount to become equal to or smaller than the second acceptable value.

5. The method of claim 1, wherein the third pattern is a pattern positioned within a certain distance from the first pattern.

6. The method of claim 2, wherein the third pattern is a pattern positioned within a certain distance from the first pattern.

7. The method of claim 3, wherein the third pattern is a pattern positioned within a certain distance from the first pattern.

8. An inspection apparatus inspecting defects of patterns provided in an inspection region of a sample and comprising a stage having an XY plane on which the sample can be placed and being movable in an X direction and a Y direction and rotatable on a Z axis substantially perpendicular to the XY plane, the apparatus comprising:

a rough alignment part performing rough alignment to confirm whether a position misalignment amount in a rotation direction of the sample with respect to the X direction or the Y direction is equal to or smaller than a first acceptable value; and a fine alignment part performing fine alignment to correct the position misalignment amount to be equal to or smaller than a second acceptable value being smaller than the first acceptable value, wherein the rough alignment part acquires an optical image of a first pattern on the inspection region of the sample, the first pattern being previously set as a pattern to be used for the rough alignment, moves the stage from a position of the stage at a time of acquisition of the optical image of the first pattern in the X direction or the Y direction by a predetermined movement amount, and recognizes that the position misalignment amount is equal to or smaller than the first acceptable value in a case where an optical image of a second pattern on the inspection region, the second pattern being previously set as a pattern to be used for the rough alignment and being positioned to be separated from the first pattern in the X direction or the Y direction, is acquired when the stage is moved by the movement amount, and recognizes that the position misalignment amount is larger than the first acceptable value in a case where an optical image of the second pattern is not acquired, and the fine alignment part acquires optical images of a plurality of third patterns to be used for the fine alignment, the third patterns being respectively positioned on a plurality of different corners of a rectangular frame constituted of four sides along the X direction or the Y direction on the inspection region of an optical image of the sample when it is confirmed by the rough alignment that the position misalignment amount is equal to or smaller than the first acceptable value, detects the position misalignment amount on a basis of the acquired optical images of the third patterns, and rotates the stage until the detected position misalignment amount becomes equal to or smaller than the second acceptable value.

\* \* \* \* \*